US009803891B2

(12) United States Patent
Barshilia

(10) Patent No.: US 9,803,891 B2
(45) Date of Patent: Oct. 31, 2017

(54) SOLAR SELECTIVE COATING HAVING HIGH THERMAL STABILITY AND A PROCESS FOR THE PREPARATION THEREOF

(75) Inventor: Harish Chandra Barshilia, Bangalore (IN)

(73) Assignee: COUNCIL OF SCIENTIFIC & INDUSTRIAL RESEARCH, New Delhi (IN)

( * ) Notice: Subject to any disclaimer, the term of this patent is extended or adjusted under 35 U.S.C. 154(b) by 629 days.

(21) Appl. No.: 14/365,303

(22) PCT Filed: Jun. 25, 2012

(86) PCT No.: PCT/IN2012/000451
§ 371 (c)(1),
(2), (4) Date: Jun. 13, 2014

(87) PCT Pub. No.: WO2013/088451
PCT Pub. Date: Jun. 20, 2013

(65) Prior Publication Data
US 2014/0329073 A1 Nov. 6, 2014

(30) Foreign Application Priority Data

Dec. 15, 2011 (IN) .......................... 3655/DEL/2011

(51) Int. Cl.
| | | |
|---|---|---|
| *F24J 2/48* | (2006.01) | |
| *C23C 14/35* | (2006.01) | |
| *C23C 14/58* | (2006.01) | |
| *C23C 14/06* | (2006.01) | |
| *C23C 14/02* | (2006.01) | |
| *C23C 14/34* | (2006.01) | |
| *C23C 14/54* | (2006.01) | |
| *C23C 28/00* | (2006.01) | |
| *F24J 2/46* | (2006.01) | |

(52) U.S. Cl.
CPC ............ *F24J 2/487* (2013.01); *C23C 14/021* (2013.01); *C23C 14/022* (2013.01); *C23C 14/025* (2013.01); *C23C 14/0641* (2013.01); *C23C 14/0676* (2013.01); *C23C 14/345* (2013.01); *C23C 14/352* (2013.01); *C23C 14/548* (2013.01); *C23C 14/5826* (2013.01); *C23C 14/5873* (2013.01); *C23C 28/322* (2013.01); *C23C 28/345* (2013.01); *F24J 2/4652* (2013.01); *Y02E 10/40* (2013.01); *Y02P 80/24* (2015.11); *Y10T 428/24975* (2015.01); *Y10T 428/265* (2015.01); *Y10T 428/31678* (2015.04)

(58) Field of Classification Search
None
See application file for complete search history.

(56) References Cited

U.S. PATENT DOCUMENTS

| | | | |
|---|---|---|---|
| 5,523,132 A | 6/1996 | Zhang et al. | |
| 7,585,568 B2 | 9/2009 | Barshilia et al. | |
| 2007/0196670 A1* | 8/2007 | Barshilia ............... | C23C 14/568 |
| | | | 428/446 |
| 2010/0313875 A1 | 12/2010 | Kennedy | |
| 2013/0125876 A1* | 5/2013 | Andritschky ....... | C23C 14/0036 |
| | | | 126/676 |
| 2014/0048059 A1* | 2/2014 | Andritschky ............ | F24J 2/487 |
| | | | 126/676 |

FOREIGN PATENT DOCUMENTS

| | | |
|---|---|---|
| CN | 101666557 | 12/2011 |
| WO | WO2004/087985 | 10/2004 |
| WO | WO2005/010225 | 2/2005 |
| WO | WO2005/121389 | 12/2005 |
| WO | WO2009/107157 | 9/2009 |
| WO | WO2009/134211 | 11/2009 |

OTHER PUBLICATIONS

Hao, Lei; Preparation and thermal stability on non-vacuum high temperature solar selective absorbing coatings; Oct. 2009; Chinese Science Bulletin; whole document.*
Selvakumar, N.; Review of physical vapor deposited (PVD) spectrally selective coatings for mid- and high-temperature solar thermal applications; Nov. 17, 2011; Solar Energy Materials & Solar Cells; whole document.*
International Search Report and Written Opinion of the International Searching Authority, PCT Application No. PCT/IN2012/000451, Council of Scientific & Industrial Research, Apr. 12, 2013.
International Preliminary Report on Patentability, PCT/IN2012/000451, Council of Scientific & Industrial Research, Apr. 4, 2014.
Hao, Lei et al., Preparation and thermal stability on non-vacuum high temperature solar selective absorbing coatings, Chinese Science Bulletin, Science China Press (SCP) and Springer, vol. 54, No. 8, Apr. 1, 2009.
Du, Miao et al., Optimization design of Ti0.5Al0.5N/Ti0.25Al0.75N/AlN coating used for solar selective applications, Solar Energy Materials and Solar Cells, Elsevier Science Publishers, Amsterdam, NL, vol. 95, No. 4, Jan. 10, 2011.

(Continued)

*Primary Examiner* — Tahseen N Khan
(74) *Attorney, Agent, or Firm* — McDonald Hopkins LLC

(57) ABSTRACT

The present invention describes an improved multilayer solar selective coating useful for solar thermal power generation. Solar selective coating of present invention essentially consists of Ti/Chrome interlayer, two absorber layers (AlTiN and AlTiON) an anti-reflection layer (AlTiO). Coating deposition process uses Ti and Al as the source materials, which are abundantly available and easy to manufacture as sputtering targets for industrial applications. The present invention allows deposition of all the layers in a single sputtering chamber on flat and tubular substrates with high absorptance and low emittance, thus making the process simpler and cost effective. The process of the present invention can be up-scaled easily for deposition on longer tubes with good uniformity and reproducibility. The coating of the present invention also displays improved adhesion, UV stability, corrosion resistance and stability under extreme environments.

20 Claims, No Drawings

(56) References Cited

OTHER PUBLICATIONS

Efeoglu, I. et al., The mechanical and tribological properties of titanium aluminium nitride coatings formed in a four magnetron closed-field sputtering system, Surface and Coatings Technology, Elsevier, Amsterdam, NL, vol. 57, No. 2-3, May 28, 1993.
Wuhrer, R. et al., A study on the microstructure and property development of d.c. magnetron cosputtered ternary titanium aluminium nitride coatings, Part III effect of substrate bias voltage and temperature, Journal of Materials Science, Kluwer Academic Publishers, BO, vol. 37, No. 10, May 1, 2002.
Lanxner, Michael et al., Solar selective absorber coating for high service temperatures, produced by plasma sputtering, SPIE vol. 1272 Optical Materials Technology for Energy Efficiency and Solar Energy Conversion IX (1990), pp. 240-249.
Grips, V.K. William et al., Electrochemical behavior of single layer CrN, TiN, TiAlN coatings and nanolayered TiAlN/CrN multilayer coatings prepared by reactive direct current magnetron sputtering, Thin Solid Films 514 (2006), pp. 204-211.
Zhang, Qi-Chu, Metal-AlN cermet solar selective coatings deposited by direct current magnetron sputtering technology, J. Phys. D. Appl. Phys. 31 (1998), pp. 355-362.
Zhang, Qi-Chu, Recent progress in high-temperature solar selective coatings, Solar Energy Materials & Solar Cells 62 (2000), pp. 63-74.
Zhang, Qi-Chu, Direct current magnetron sputtered W-AlN cermet solar absorber films, J. Vac. Sci. Technol. A 15(6), Nov./Dec. 1997, pp. 2842-2846.
Chang, Yin-Yu et al., Characterization of nanocrystalline AlTiN coatings synthesized by a cathodic-arc deposition process, Surface & Coatings Technology 201 (2007), pp. 6699-6701.
Endrino, J.L. et al., Hard AlTiN, AlCrN PVD coatings for machining of austenitic stainless steel, Surface & Coatings Technology 200 (2006), pp. 6840-6845.
Mikhelashvili, V. et al., Composition, surface morphology and electrical characteristics of Al2O3-Tio2 nanolaminates and AlTiO films on silicon, Thin Solid Films 515 (2006), pp. 346-352.
Lei, Hao et al., Preparation and thermal stability on non-vacuum high temperature solar selective absorbing coatings, Chinese Science Bulletin, Apr. 2009, vol. 54, No. 8, pp. 1451-1454.
Birol, Yucel et al., Thermal cycling of AlTiN- and AlTiON-coated hot work tool steels at elevated temperatures, Materials Science and Engineering A 528 (2011), pp. 4703-4709.
Deepthi, B. et al., Mechanical and tribological properties of sputter deposited nanostructured Cr-WS2 solid lubricant coatings, Surface & Coatings Technology 205 (2010), pp. 1937-1946.
Window, B. et al., Progress in the Materials Science of All-Glass Evacuated Collectors, Solar Energy, vol. 32, No. 5, 1984, pp. 609-623.
Endrino, J.L., et al., Oxidation post-treatment of hard AlTiN coating for machining of hardened steels, Surface & Coatings Technology 204 (2009), pp. 256-262.
Arndt, Mirjam et al., Performance of new AlTiN coatings in dry and high speed cutting, Surface and Coatings Technology 163-164 (2003), pp. 674-680.
Esposito, S., et al., Fabrication and optimisation of highly efficient cermet-based spectrally selective coatings for high operating temperature, Thin Solid Films 517 (2009), pp. 6000-6006.

\* cited by examiner

SOLAR SELECTIVE COATING HAVING HIGH THERMAL STABILITY AND A PROCESS FOR THE PREPARATION THEREOF

FIELD OF INVENTION

The present invention relates to an improved solar selective coating having high thermal stability and a process for the preparation thereof. More particularly, it relates to a multilayer solar selective coating containing tandem stacks of titanium (Ti)/Chrome interlayer, aluminum-titanium nitride (AlTiN), aluminum-titanium oxynitride (AlTiON) and aluminum-titanium oxide (AlTiO) coated on metallic and non-metallic substrates using a four-cathode reactive unbalanced pulsed direct current magnetron sputtering technique.

BACKGROUND OF INVENTION AND DESCRIPTION OF PRIOR ART

Solar selective coatings are used as absorbers for harnessing solar energy for various applications. One of the essential requirements of solar selective absorbers is their stable structural composition when they operate at high temperatures. Optical properties of these coatings should not degrade with rise in temperature or over a period of use. The main utility of the present invention is for high temperature applications, particularly, in solar steam generators and steam turbines for producing the electricity.

In recent years a greater attention has been shown in harnessing alternative sources of energy like solar energy for industrial applications. Generally, concentrating type solar collectors are popularly used in industries for high temperature applications. Solar selective coatings applied to solar absorbers have been proved as an efficient method for harnessing the solar energy on large scale. The sputtering processes are widely being used to deposit solar absorber coatings for high temperature applications as these processes are environmental friendly and also offer to deposit complex compounds with controlled composition and microstructure. The coating of the present invention is deposited using a sputtering method, which is environmental friendly.

Earlier, applicant had developed a high temperature thermally stable solar selective coating, for effectively harnessing the solar energy. Patent application was filed and U.S. Pat. No. 7,585,568 was granted by USPTO for the invention. In U.S. Pat. No. 7,585,568, TiAlN/TiAlON/$Si_3N_4$ high temperature solar selective coating was deposited on various metal and non-metal flat substrates. Even though the invention has a great potential for solar thermal power generation, up-scaling of the process for industrial applications has following constraints: (1) It uses two separate sputtering systems to deposit the absorber layers (TiAlN and TiAlON) and anti-reflection layer ($Si_3N_4$). (2) It uses a composite TiAl target, therefore, the composition (i.e., contents of Ti and Al) of the absorber layer cannot be controlled independently. (3) The invention uses silicon (Si) as one of the source materials, which is expensive and very difficult to manufacture for large industrial sputtering machine. (4) The invention uses top-down geometry of the sputtering process and deposition on non-planar substrates is not feasible. (5) Long term thermal stability studies of the absorber coating under cyclic heating conditions and other aging tests have not been carried out.

All above limitations of the earlier invention directed inventors to evolve a coating formulation and deposition process, which can be suitable for high temperature applications in harnessing the solar energy. Present invention provides a multilayer solar selective coating containing tandem stacks of Ti/Chrome interlayer, aluminum-titanium nitride (AlTiN), aluminum-titanium oxynitride (AlTiON) and aluminum-titanium oxide (AlTiO). The solar selective coating of the present invention has been deposited by a single four-cathode reactive unbalanced pulsed direct current magnetron sputtering technique.

Prior-art search was made in public domain for patent as well as non-patent literature to find out the related work carried out in areas of the present invention. Some of the recent works, which are related to the field of the present invention, are discussed below.

A large number of solar selective coatings such as Ni—$Al_2O_3$, Ni—$SiO_2$, Fe—$Al_2O_3$, Cr—SiO, Mo—$Al_2O_3$, Mo—$SiO_2$, W—$Al_2O_3$, etc. have been developed for high temperature solar thermal applications. But only a few of them such as Mo—$SiO_2$, W—$Al_2O_3$, Mo—$Al_2O_3$ and M—AlN (M: SS, W and Mo) cermets have been successfully commercialized and are being used in evacuated receiver tubes for solar thermal power generation. Mo—$Al_2O_3$ cermet coatings have been used on receiver tubes due to their excellent thermal stability in vacuum [Proceedings of the Society of Photo-Optical Instrumentation Engineers 1272 (1990) 240]. These receiver tubes were produced by Luz International Ltd., USA and were used in Solar Energy Generating System power plants. The Mo—$Al_2O_3$ cermet coatings were deposited using planar magnetron sputtering technology consisting of seven planar targets (three metallic and four ceramic targets), wherein, the metal targets are direct current (DC) sputtered and ceramic targets are sputtered using radio frequency (RF) power. Use of RF power supplies for industrial applications makes the process very expensive as well as cumbersome as a suitable matching network is required to operate an RF power supply. Additionally, sputtering of compound targets such as $Al_2O_3$ is challenging because of very low sputtering yield, high RF power levels and also control of stoichiometry of the deposited coating is extremely difficult. The Mo—$Al_2O_3$ cermet coatings are reported to exhibit an absorptance of 0.96 and emittance of 0.16 at 350° C. with thermal stability of 350-500° C. in vacuum. Despite the fact that this absorber coating is highly stable in vacuum, it has limited thermal stability in air (up to 300° C.).

It has been reported that the Mo—$Al_2O_3$ coatings are expensive when compared to other DC sputtered SS-C and AlN solar selective coatings, which are also produced on a commercial scale [Solar Energy 32 (1984) 609]. Double layer cermet concept has been developed to deposit SS-AlN coatings [Journal of Vacuum Science and Technology A 15 (1997) 2842] and these coatings are commercially marketed by TurboSun, China. The W—AlN and Mo—AlN double layer cermet coatings have been developed by sputtering process [U.S. Pat. No. 5,523,132, 1996, Journal of Physics D: Applied Physics 31 (1998) 355]. A solar absorptance of 0.92-0.94 and emittance of 0.08-0.10 at 350° C. were achieved for the W—AlN and Mo—AlN cermet coatings. These coatings are thermally stable at 350-500° C. in vacuum and are lower in cost than the Siemens CSP Tubes, Germany (formerly Solel Tubes) [Solar Energy Material and Solar Cells 62 (2000) 63]. Solel's Universal Vacuum Air Collector (UVAC2008) receiver tube uses an $Al_2O_3$ based multilayer cermet, which has an absorptance of 0.97-0.98 and emittance of 0.07-0.10 at 400° C. Further details about the substrate material and coating composition and properties are not available in the public domain.

Archimedes Solar Energy, Italy produces receiver tubes (HEMS08) for Italian National Agency for New Technologies, Energy and Environment (ENEA) Solar Thermodynamic Project, where the thermal exchange fluid is a molten salt entering at 290° C. in the solar field and coming out at 550° C. [http://www.archimedesolarenergy.com/receiver_tube.htm]. The receiver tube and the solar selective coating are reported to be very stable up to 580° C. The HEMS08 receiver tubes are coated with selective coatings of Mo—$SiO_2$ (or) W—$Al_2O_3$ [Thin Solid Films 517 (2009) 6000, WO2009/107157 A2]. Solar absorptance greater than 0.94 and emittance lower than 0.13 (at 580° C.) have been reported for Mo—$SiO_2$ coatings. The structure of this coating is as follows: Mo/Mo—$SiO_2$ (HMVF)/Mo—$SiO_2$ (LMVF)/$SiO_2$. Similarly, graded W—$Al_2O_3$ coating exhibit $\alpha/\in$(550° C.)=0.93/0.14 and this coating was thermally stable at 580° C. in vacuum, where HMVF and LMVF represent high metal volume fraction and low metal volume fraction, respectively. These inventors have also developed graded TiN—AlN cermets with AlN or $Al_2O_3$ antireflection coating exhibiting absorptance of 0.95 and emittance of 0.12 at 580° C. [WO 2005/121389 A1, 2005].

The composition of the PTR® 70 receiver tube developed by Schott, Germany is not known, but uses a new type of anti-reflection coating, which has a high abrasion resistance and at the same time allows the transmission of more than 96% of the sun's radiation [http://www.schottsolar.com/global/products/concentrated-solar-power/schott-ptr-70-receiver/]. The absorber coating has an absorptance of 0.95 and low emittance (<0.10) at a temperature of about 350-400° C. Further details about the absorber coating composition are not available in the public domain.

References may be made to Surface and Coatings Technology: [163-164 (2003) 674], [200 (2006) 6840], [201 (2007) 6699] and [204 (2009) 256], wherein various researchers have developed nanocrystalline AlTiN coatings for dry and high speed machining of hardened tool steel. The AlTiN coating has been shown to exhibit extraordinary performance in high speed machining of hardened tool steel. This is attributed to high adhesion, ultra-fine crystalline as well as high oxidation resistance of the coating. The high oxidation resistance of nanocrystalline AlTiN coating has been related to the formation of aluminum oxide ($Al_2O_3$) surface layer. The oxide formation has been shown to be more pronounced for nanocrystalline coating as it promotes rapid diffusion of Al to the surface along the grain boundaries.

References may also be made to Materials Science and Engineering A 528 (2011) 4703, wherein researchers have used AlTiON coatings for protection against oxidation of hot work tool samples. It has been reported that the formation of $Al_2O_3$ at elevated temperatures improves the performance of the coated tools. Similarly, references may also be made to Thin Solid Films 515 (2006) 346, wherein AlTiO films have been developed on silicon substrates for metal-oxide-semiconductor (MOS) devices. The AlTiO films exhibit very high dielectric constant, twice as large as demonstrated by the well known HfAlO dielectric thin films. The search on public domain regarding optical properties of AlTiN, AlTiON and AlTiO yielded no results.

References may be made to "Preparation and thermal stability of non-vacuum high temperature solar selective absorber coatings" [Chinese Science Bulletin 54 (2009) 1451] and "Non-vacuum solar spectrum selective absorption film and preparation method thereof" [Chinese Patent: CN 101666557A], wherein approximately 2.0 μm thick TiAl/TiAlN/TiAlNO/TiAlO absorber layer has been prepared using a multi-arc ion deposition facility from a TiAl alloy target with ratio of Ti to Al of 50:50. These inventors have reported that the said coating exhibits high absorptance (0.90) and low emittance (0.09-0.19) and remains stable in air up to 650° C. for 1 hr. Long term thermal stability in air and vacuum and detailed studies on the optical properties have not been reported by these inventors. The process employed in this invention uses multi-arc ion plating, which has inherent disadvantage that dense and uniform absorber coating with optical thicknesses ($\lambda/4 \cong 120$ nm) cannot be prepared. Also the invention uses a TiAl alloy target and it is not possible to control the content of Ti and Al in the absorber layers independently. Additionally, the multi-arc ion plating process introduces a large number of metal droplets, which deteriorate the properties of the deposited coatings.

References may also be made to "High temperature solar selective coating" [U.S. Patent No. 2010/0313875 A1], wherein the absorber tubes are coated with improved solar selective coating comprising of several layers of refractory metals or metalloid oxides (titania and silica) with substantially differing indices of refraction in adjacent layers. The absorber layers include cermets materials comprising particles of metal compounds in a matrix, which contain oxides of refractory metals or metalloids such as Si. At least one layer of Pt is also included between some of the absorber layers. The absorber coating also comprises reflective layers from the following compounds: TiSi, $Ti_3SiC_2$, TiAlSi, TiAlN, $Ti_3O_5$, $TiO_x$ or $TiO_xN_{1-x}$, etc. These multilayer absorber coatings have been found to have a stable thermal emittance up to 500° C.

In order to manufacture the absorber coatings for industrial applications it is important that the deposition process should be simpler and involve less processing steps and also the raw materials should be cost effective, yet the absorber coating must exhibit high thermal stability and high solar selectivity. None of the prior-art referred as above shows all these features. Therefore, there is a need to develop easy to process and cost effective high temperature solar selective coatings for solar thermal power generation applications.

The present invention also allows deposition of all the layers in a single sputtering chamber, thus making the process simpler and cost effective. The present invention is capable of depositing absorber coating on both planar and tube-like substrates. The tubular substrates with a length of approximately 140 mm and diameter up to 100 mm can be coated in the present invention. The process of the present invention can be up-scaled easily for the deposition on longer tubes with good uniformity and reproducibility, considering the above limitations as disclosed in the prior-art literature.

OBJECTS OF THE INVENTION

The main objective of the present invention is thus to provide an improved solar selective multilayer coating with high uniformity and long term thermal stability in air and vacuum, using four-cathode reactive pulsed direct current unbalanced magnetron sputtering process on flat and tubular substrates.

Another objective of the present invention is to provide solar selective multilayer coatings prepared by a four-cathode reactive unbalanced pulsed direct current magnetron sputtering technique having chemical inertness, corrosion resistance, ultraviolet stability and higher humidity resistance.

Yet another objective of the present invention is to provide solar selective multilayer coatings having high hardness and high scratch resistances.

Still another objective of the invention is to provide solar selective multilayer coatings having higher solar selectivity ratio in order of 5 to 13 on stainless steel 304 (SS) and copper substrates.

Yet another objective of this invention is to provide a process for depositing solar selective multilayer coatings on flat reflecting substrates such as copper, stainless steel 304, nickel coated SS, mild steel (MS), glass, aluminum, nickel, nickel containing superalloy (nimonic) and copper and stainless steel tubes.

Still another objective of the invention is to provide solar selective coatings having very high thermal resistance suitable for applications in concentrating collectors like evacuated tubes useful for solar steam generation.

SUMMARY OF THE INVENTION

Accordingly, the present invention provides an improved solar selective coating having high thermal stability comprising tandem stack of layers consisting of an interlayer of titanium (Ti)/chrome followed by a first absorber layer comprising aluminum-titanium nitride (AlTiN), a second absorber layer comprising aluminum-titanium oxy-nitride (AlTiON) and a third antireflection layer comprising aluminum-titanium oxide (AlTiO), said second absorber layer deposited on the first absorber layer and said third antireflection layer deposited on the second absorber layer at substrate temperature in the range 100-350° C. using a four-cathode reactive pulsed direct current unbalanced magnetron sputtering technique.

In an embodiment of the present invention, thickness of the Titanium interlayer in the range of 10-80 nm, thickness of the first absorber layer is in the range of 30-70 nm, thickness of the second absorber layer is in the range of 20-40 nm and thickness of the third anti-reflection layer is in the range of 30-55 nm.

In another embodiment of the present invention, thickness of the chrome interlayer is in the range of 5-10 µm, deposited by conventional electroplating.

In another embodiment of the present invention, the first absorber layer contains Aluminium concentration in the range of 25-55%, Titanium concentration in the range of 10-25% and Nitrogen concentration in the range of 30-50%.

In still another embodiment of the present invention, the second absorber layer contains Aluminium concentration in the range of 15-30%, Titanium concentration in the range of 10-15%, Nitrogen concentration in the range of 10-20% and Oxygen concentration in the range of 50-60%.

In yet another embodiment of the present invention, the third anti-reflection layer contains Aluminium in the range of 15-30%, Titanium in the range of 5-15% and Oxygen in the range of 40-80%.

In still another embodiment of the present invention, the deposition of all the layers is done in the single sputtering chamber.

In yet another embodiment of the present invention, the multilayer solar selective coatings are sputter deposited on flat and tubular metal and non-metal substrates.

In still another embodiment of the present invention, the substrate used is selected from the group consisting of copper, nickel, stainless steel 304, glass nimonic, nickel coated SS, mild steel (MS), aluminum.

In yet another embodiment of the present invention, the solar selective coating has absorptance greater than 0.92 and emittance less than 0.17 on stainless steel 304 substrate.

In yet another embodiment of the present invention, the solar selective coating has absorptance greater than 0.92 and emittance less than 0.07 on copper substrates.

In yet another embodiment of the present invention, the coating is thermally stable in air up to 350° C. for a duration of 1000 hrs on stainless steel substrates under cyclic heating conditions.

In yet another embodiment of the present invention, the coating is thermally stable in vacuum (2.0-8.0×10$^{-4}$ Pa) up to 450° C. for a duration of 1000 hrs on stainless steel substrates under cyclic heating conditions.

In still another embodiment of the present invention, the coating is stable under exposure to ultraviolet (UV) irradiation.

In yet another embodiment of the present invention, the coating is stable at temperature under −2° C. for more than 9600 hrs. the coating is stable when exposed to sun in ambient conditions including dust, rain and mist for more than 10000 hrs.

In yet another embodiment of the present invention, the coating is stable when exposed to steam for up to 85 hrs.

In yet another embodiment of the present invention, the coating deposited on stainless steel substrates qualifies salt spray test as per ASTM 8117 standard and shows improvement in the corrosion resistance by a factor of 100 in 3.5% NaCl solution.

In yet another embodiment of the present invention, the coating deposited on stainless steel substrates qualifies tape adhesion test and demonstrates high adhesion strength while scratching using a 5 µm diamond tip.

Still another embodiment of the present invention provides a process for the deposition of improved solar selective coating of claim 1 on a substrate, comprising the following steps:

[a] metallographic or buff cleaning of substrate;

[b] chemical cleaning of the substrate as obtained in step [a];

[c] degassing of the substrate as obtained in step [b] in vacuum using a substrate heater;

[d] etching of the substrate as obtained in step [c] in Argon plasma to remove the impurities;

[e] depositing a Titanium/Chrome interlayer on the substrate as obtained in step [d] in argon plasma by maintaining the substrate temperature in the range 100-350° C. and bias voltage in the range −50 to −200 V;

[f] depositing a first absorber layer comprising aluminum titanium nitride (AlTiN) on the substrate as obtained in step [e] by sputtering two Titanium and two Aluminium targets in argon-nitrogen plasma by maintaining the substrate temperature in the range 100-350° C. and bias voltage in the range −50 to −200 V;

[g] depositing a second absorber layer comprising aluminum-titanium oxy-nitride (AlTiON) on the substrate as obtained in step [f] by sputtering two Titanium and two Aluminium targets in argon-nitrogen-oxygen plasma by maintaining the substrate temperature in the range 100-350° C. and bias voltage in the range −50 to −200 V;

[h] depositing a third antireflection layer comprising aluminum-titanium oxide (AlTiO) on the substrate as obtained in step [g] by sputtering two Titanium and two Aluminium targets in argon-oxygen plasma by maintaining the substrate temperature in the range of 100-350° C.;

[i] etching of the antireflection layer as obtained in step [h] in argon-oxygen plasma for a duration of 20-60 min by maintaining substrate temperature in the range 100-350° C. and bias voltage in the range −500 to −1200 V to obtain the substrate deposited with desired solar selective coating.

In yet another embodiment of the present invention, the substrate used is selected from the group consisting of copper, nickel, stainless steel 304, glass nimonic, nickel coated stainless steel (SS), mild steel (MS) and aluminum.

In yet another embodiment of the present invention, deposition of all the layers is done in a single sputtering chamber on flat and tubular metal and non-metal substrates.

In yet another embodiment of the present invention, the solar selective coating is deposited at a sputtering power density of 2.75-3.5 watts/cm$^2$ for Aluminium and Titanium targets.

In yet another embodiment of the present invention, compositions of the first, second and third layers are independently controlled by controlling the sputtering power to the Aluminium and Titanium targets and the flow rates of $N_2$ and $O_2$ In yet another embodiment of the present invention, vacuum chamber is maintained at a base pressure of 3.0-6.0×10$^{-4}$ Pa before deposition of the coating.

In yet another embodiment of the present invention, the solar selective coating is deposited in the pressure range of 0.1-0.5 Pa.

In a further embodiment, the present invention provides an improved high temperature solar selective coating containing tandem stacks of Ti/Chrome interlayer, twin absorber layers mainly aluminum-titanium nitride (AlTiN), aluminum-titanium oxynitride (AlTiON) and an anti-reflection layer consisting of aluminum-titanium oxide (AlTiO). As stated above, the invention uses two titanium and two aluminum targets to achieve both absorber layers and the anti-reflection layer so that the contents of Ti and Al in the absorber layers and the anti-reflection layer can be controlled independently by controlling the sputtering power to the Ti and Al targets and flow rates of $O_2$ and $N_2$ gases.

In still another embodiment of the present invention, the Al content is always greater than Ti content in the absorber layers and anti-reflection layer. The selected layers namely, AlTiN, AlTiON and AlTiO are highly stable with respect to oxidation. The present invention uses more Al than Ti in all the layers as Al forms $Al_2O_3$ more easily than $TiO_2$ when exposed to air. The Gibbs free energy at 25° C. for $Al_2O_3$ (corundum) and $TiO_2$ (anatase) are −378 and −211 kcal/mol [CRC Handbook of Chemistry and Physics, Edt. by R. C. Weast and M. J. Astle (CRC Press, Inc., Boca Raton, 63$^{rd}$ Edition, 1982), p. D-53 and D-92]. Therefore, when the absorber coating is exposed to air, there is a formation of a thin amorphous $Al_2O_3$ layer on the absorber coating, which acts as passivation for the subsequent oxidation. Additionally, both $Al_2O_3$ and $TiO_2$ are highly stable at higher temperature with melting points of 2015 and 1840° C., respectively.

In yet another embodiment, the present invention eliminates use of Si target for the deposition of anti-reflection layer. Si material is very expensive and difficult to manufacture compared to Ti and Al, which are abundantly available. Furthermore, the third anti-reflection layer has been etched with Ar+$O_2$ plasma at elevated temperature to enhance the oxidation resistance of the absorber coating and microstructure.

DETAILED DESCRIPTION OF THE INVENTION

The present invention provides a multilayer solar selective coating having higher thermal stability and long life in the order of 1000 hrs under cyclic heating conditions in air at 350° C. It also provides a multilayer solar selective coating having higher thermal stability in vacuum at 450° C. and stability up to 1000 hrs under cyclic heating conditions. Solar selective coating of the present invention exhibits higher solar selectivity ratio in the order of 5-10 on stainless steel 304 substrates and 13 on copper substrates. The first absorber layer. AlTiN exhibits high temperature stability and better oxidation resistance (up to 750-800° C.). The second absorber layer AlTiON also exhibits higher thermal stability. Similarly, the third antireflection layer AlTiO exhibits very high oxidation resistance. The third layer (AlTiO) has been further etched in Ar+$O_2$ plasma at a substrate temperature in the range of 100-350° C. for 10-60 min to generate microtexturing as well as to stabilize the structure. The substrates have been sputter etched in Ar plasma (−500 to −1200 V) to remove contaminants before coating deposition and a thin Ti/Chrome interlayer between the substrate and absorber coating has been deposited. The sputter etching and the Ti/Chrome interlayer enhance the adhesion of the absorber layer significantly. Thus, the combination of layers selected in the present invention provides high thermally stable, high oxidation resistance, chemically inert, stable microstructure, highly adherent and graded composition solar selective absorber coating useful for high temperature applications.

The objects of the invention have, been achieved by adopting the following steps:

1. Deposition of Ti interlayer/chrome in order to have good adhesion of coating to the substrate and then depositing a tandem stack of multilayer coating comprising two absorber layers in which the first absorber layer (AlTiN) is tailor made to have high metal volume fraction and the second absorber layer (AlTiON) having low metal volume fraction for enhancing the absorption of the coating. The first and second layers comprise of more Al content than Ti for enhancing the thermal stability of the absorber coating.
2. Providing third antireflection layer (AlTiO) for reducing the infrared emittance so as to increase the absorption further. The third layer also comprises of more Al content than Ti.
3. Carefully selecting the candidate materials and their composition for depositing AlTiN, AlTiON and AlTiO layers so that the inter-diffusion between the layers of the tandem stack is minimal and the microstructure is stable even at higher working temperatures.

The present invention provides an improved multilayer solar selective coating useful for solar thermal power generation. Solar selective coating of present invention essentially consists of a Ti/Chrome interlayer, two absorber layers (AlTiN and AlTiON) and an anti-reflection layer (AlTiO). Coating deposition process uses two titanium and two aluminum targets to deposit both absorber layers and the anti-reflection layer so that the contents of Ti and Al in the absorber layers and the anti-reflection layer can be controlled independently by controlling the sputtering power to the Ti and Al targets using bipolar pulsed DC power supplies and $N_2$ and $O_2$ flow rates. The content of Al is higher than Ti in all the layers, which enhances the thermal stability of the absorber coating as Al very easily forms a passive amorphous $Al_2O_3$ layer when exposed to air. The present invention uses Ti and Al as the source materials, which are abundantly available and easy to manufacture as sputtering targets for industrial applications. The anti-reflection layer of the present invention has been etched with $Ar+O_2$ plasma at a temperature in the range 100-350° C. to enhance the oxidation resistance of the absorber coating and stabilize the microstructure. The present invention also allows deposition of all the layers in a single sputtering chamber on flat and tubular substrates (metallic and non-metallic) with high absorptance (>0.93) and low-emittance (<0.16 on SS 304 and <0.07 on copper substrates), thus making the process simpler and cost effective. The process of the present invention can be up-scaled easily for deposition on longer tubes with good uniformity and reproducibility. The absorber coating of the present invention has been shown to display thermal stability in air (up to 350° C.) and vacuum (up to 450° C.) for longer durations (>1000 hrs) under cyclic heating conditions. The coating of the present invention also displays improved adhesion, UV stability, corrosion resistance and stability under extreme environments (freezing condition, exposure to steam and to atmosphere).

The solar selective multilayer coating of the present invention was deposited using a four-cathode reactive pulsed direct current magnetron sputtering process. The sputtering system consists of: vacuum chamber, turbo molecular pump, rotary pump, four direct cooled unbalanced magnetron cathodes mounted horizontally in opposed-cathode configuration, four 5 kW asymmetric-bipolar pulsed plasma generators, 1.5 kW DC power supply for substrate bias and ion bombardment, substrate holder plate for mounting three-dimensional objects with planetary rotation and heating facility, vacuum gauges and control consoles.

In order to deposit absorber coating, two Ti (purity=99.95%) and two Al (purity=99.99%) targets (diameter=150 mm and thickness of 12 mm) were sputtered in high purity Ar (99.999%) plasma containing $N_2$ (99.999%) and $O_2$ gases (99.999%). The coatings were deposited under a base pressure of $3.0$-$6.0 \times 10^{-4}$ Pa and $Ar+N_2$, $Ar+N_2+O_2$ and $Ar+O_2$ gas pressures were in the range of $1.0$-$5.0 \times 10^{-1}$ Pa. The flow rates of Ar, $N_2$ and $O_2$ were controlled separately by mass flow controllers. A DC substrate bias in the range of $-50$ to $-200$ V was applied to improve the mechanical properties of the coating and also to improve the adhesion of the coating. The pulsed generators were operated at the following conditions: frequency=50-150 kHz, pulse width=2000-3000 ns, duty cycle=10-40% and reverse bias voltage=+37 V. The coatings were deposited at a substrate temperature in the range of 100-350° C. The power density for Al and Ti targets was in the range of 2.75-3.5 watts/cm². A 10-80 nm thick Ti interlayer was deposited to improve the adhesion of the coating on the substrates.

The coatings were deposited on various substrates. Before putting the substrates into the vacuum chamber, they were metallographically polished or buffed to remove the surface oxides and to make the surface homogeneous. The polished/buffed substrates were then chemically cleaned using an ultrasonic agitator to remove the grease and other impurities such as dust and debris. Chemically cleaned substrates were positioned in the sputtering system. The vacuum chamber was pumped down to a base pressure in the order of $3.0$-$6.0 \times 10^4$ Pa to remove any gaseous impurities. The substrates were degassed in vacuum using a substrate heater. In order to remove native oxides on the substrate surface further cleaning was carried out using argon ion bombardment (bias voltage: $-500$ to $-1200$ V). After cleaning the substrates a Ti interlayer of 10-80 nm was deposited on the substrates for improving the adhesion. For chrome plated samples, titanium interlayer was not used. The first absorber layer was deposited by sputtering of two Ti and two Al targets in the argon-nitrogen plasma at a pressure in the range of 0.1-0.5 Pa. The content of Al was higher than Ti in the first absorber layer. The second absorber layer was deposited by sputtering of two Ti and two Al targets in the argon-nitrogen-oxygen plasma at a pressure in the order of 0.1-0.5 Pa. The content of Al was higher than Ti in the second absorber layer. Subsequently, the third anti-reflection layer was deposited by sputtering of two Ti and two Al targets in the argon-oxygen plasma at a pressure of the order of 0.1-0.5 Pa. Again, the content of Al was higher than Ti in the third anti-reflection layer. Finally, the third layer was etched in $Ar+O_2$ plasma at a substrate temperature in the range of 100-350° C. for a duration of 20-60 min to stabilize the microstructure of the AlTiO layer. The tandem stack of three layers effectively increased the absorptance ($\alpha$) and reduced the emittance ($\in$) of the solar selective coating.

The optical properties ($\alpha$ and $\in$) of the samples were measured at four different positions and an average of them is reported herein. The solar selective coating was annealed in air and vacuum under cyclic heating conditions at different temperatures for testing the thermal stability. The thicknesses of the deposited layers were measured using transmission electron microscopy.

EXAMPLES

The following examples are given by way of illustration and therefore should not be construed to limit the scope of the present invention.

Example 1

Before putting the substrates into the vacuum chamber the substrates (copper, nickel, stainless steel 304, Ni coated SS, mild steel, glass and nimonic, having dimensions 35 mm×35 mm×2 mm) were metallographically polished or buffed and chemically cleaned in an ultrasonic agitator in acetone, absolute alcohol and trichloroethylene. The tubular substrates (140 mm length and 30 mm diameter) were buffed and chemically cleaned as mentioned above. In order to reduce the emittance of the selective coating on stainless steel substrate, chrome plating of thickness of 5 µm was deposited using conventional electroplating process. The vacuum chamber was pumped down to a base pressure of $1.0 \times 10^{-4}$ Pa using a turbo-molecular pump backed by a rotary pump. The substrates were cleaned in situ to remove the impurities by etching with argon ion bombardment for 60 min, wherein a DC bias of $-500$ V was applied to the substrate at an argon pressure of $8.0 \times 10^{-1}$ Pa.

After cleaning the substrates a Ti interlayer of 10-80 nm was deposited on the substrates for improving the adhesion. For chrome plated samples, titanium interlayer was not used. The solar absorber film was deposited on the substrates using four-cathode reactive pulsed direct current unbalanced magnetron sputtering system. Two Ti and two Al targets were used for the sputtering of AlTiN (first absorber) layer, AlTiON (second absorber) layer and AlTiO (third anti-reflection) layer. The power densities for Ti and Al targets were 2.75 and 3.0 watts/cm², respectively. The substrates were heated at a temperature of 200° C. For the AlTiN (first absorber) layer the nitrogen flow rate was 15 standard cubic centimeter per minute (sccm). For the AlTiON (second absorber) layer the nitrogen flow was 10 sccm and the oxygen flow rate was 20 sccm. Whereas, the oxygen flow rate for the AlTiO layer was in 30 sccm. The said third anti-reflection layer was etched in Ar+$O_2$ plasma with an oxygen flow rate 40 sccm and a substrate temperature of 200° C. A planetary rotation system was employed for achieving uniform absorber coating on flat as well as on tubular substrates.

The optical properties (absorptance and emittance) of the samples were measured using standard instruments procured from M/s. Devices and Services, USA. Emittance was measured at 82° C. The accuracies for the measurements of the emittance and the absorptance were ±0.01 and ±0.002, respectively. The absorptance and the emittance values for stainless steel (SS) substrate, SS/Ti/AlTiN, SS/Ti/AlTiN/AlTiON, SS/Ti/AlTiN/AlTiON/AlTiO and SS/Ti/AlTiN/AlTiON/AlTiO/etching are given in Table 1. The absorber coating on the SS substrate with titanium interlayer exhibited absorptance of 0.927-0.930 and emittance of 0.16-0.1, whereas, for chrome plated samples absorptance was 0.930-0.935 and emittance was 0.09-0.10.

TABLE 1

Absorptance and emittance of different layers of the solar selective coating system of the present invention. Also shown are the values of SS 304.

| Material | α | ε |
| --- | --- | --- |
| SS substrate (304) | 0.361-0.363 | 0.10-0.11 |
| SS/Ti | 0.477-0.478 | 0.13 |
| SS/Ti/AlTiN | 0.802-0.803 | 0.15-0.16 |
| SS/Ti/AlTiN/AlTiON | 0.900 | 0.16-0.17 |
| SS/Ti/AlTiN/AlTiON/AlTiO | 0.927 | 0.16-0.17 |
| SS/Ti/AlTiN/AlTiON/AlTiO/etching | 0.927-0.930 | 0.16-0.17 |
| SS/chrome/AlTiN/AlTiON/AlTiO/etching | 0.930-0.935 | 0.09-0.10 |

Example 2

The solar selective coating of the present invention as stated in Example 1 was mainly deposited on SS 304 and exhibited an average emittance of 0.16-0.17. The high emittance on SS substrate is attributed to the intrinsic property of the SS substrate ($\epsilon$=0.10-0.11). The SS substrate chosen for the present invention is mainly due to the fact that for steam generation, the substrate may reach a temperature greater than 400° C. and at these temperatures copper and other commonly used substrates start diffusing to the absorber coating, thus affecting its optical properties. Additionally, copper and other metallic substrates get corroded very easily with supersaturated steam.

In order to confirm that the emittance of the absorber coating of the present invention was substrate dependent, the solar selective coating was also deposited on other commercial available flat substrates such as: nickel, mild steel, aluminum, glass and nickel based superalloy (nimonic). The absorptance and the emittance values of the solar selective coating on these substrates are given in Table 2 along with the intrinsic absorptance and emittance values of the substrates. The absorber coating prepared on Ni, Cu and Al substrates exhibited emittance values of 0.06-0.07.

TABLE 2

Absorptance and emittance of solar selective coating deposited on various substrates. Values in the bracket represent the intrinsic absorptance and emittance of the substrate.

| Substrate Material | α | ε |
| --- | --- | --- |
| Copper | 0.932-0.933 (0.234-0.238) | 0.07 (0.02-0.03) |
| Glass* | 0.927-0.928 | — |
| Aluminum | 0.927-0.928 (0.169-0.173) | 0.07 (0.02-0.03) |
| Nickel | 0.27 (0.333-0.336) | 0.07-0.08 (0.03-0.04) |
| Stainless steel | 0.932-0.934 (0.361-0.363) | 0.16-0.17 (0.10-0.11) |
| Ni coated stainless steel | 0.932-0.933 (0.334-0.337) | 0.07-0.08 (0.03-0.04) |
| Mild steel | 0.930 (0.400-0.401) | 0.11 (0.04-0.05) |
| Nimonic | 0.924 (0.344-0.345) | 0.19 (0.13-0.14) |

*Semi-transparent. The measurements may not be accurate.

Additionally, the SS substrates were also coated with approximately 5.0 μm thick Ni layer and subsequently the absorber coating was deposited on this substrate. Interestingly, the emittance of this coating was as low as 0.07-0.08 and the absorptance was 0.932-0.933.

Example 3

The solar selective coating of the present invention deposited on SS substrates, as deposited in Example 1, was heated in air in a resistive furnace at a temperature in the range of 300-600° C. for different durations under cyclic heating conditions to test the thermal stability. Annealing involved increasing the temperature of the sample from room temperature to the set temperature at a slow heating rate of 3° C./min and maintaining the desired temperature for 8 hrs. Subsequently, the sample was cooled down at a rate of 3° C./min. The accuracy of the temperature controller was ±1° C. at the set temperature. The absorptance and the emittance values of the absorber coating after heat-treatment indicated that the absorber coating was stable for temperature less than 400° C. for shorter durations and for temperature greater than 450° C. the absorptance decreased significantly.

The thermal stability of the absorber coating deposited on Ni coated SS yielded low thermal stability. This coating when heated to higher temperature (>400° C.) in air peeled off mainly because of different thermal expansion coefficients of SS, Ni and the absorber coating.

In order to test the long term thermal stability of the absorber coating of the present invention the heat treatment studies were carried out at 350° C. under cyclic heating conditions for 1000 hrs. The absorptance and emittance values were measured at different intervals and are summarized in Table 3. As seen from Table 3 the absorber coating of the present invention is highly stable in air at 350° C. for longer durations. No structural changes were observed as a result of prolonged heating. This demonstrates that the coating of the present invention can be used for applications in air wherein the temperature is less than 350° C. (for example, linear Fresnel technology).

TABLE 3

Effect of annealing (in air at 350° C.) on optical properties of the Ti/AlTiN/AlTiON/AlTiO solar selective coating deposited on SS substrate under cyclic heating conditions.

| Days | Total time of exposure (hrs) | α | ε |
| --- | --- | --- | --- |
| 0 | 0 | 0.932-0.933 | 0.16 |
| 6 | 41 | 0.927-0.928 | 0.16 |

TABLE 3-continued

Effect of annealing (in air at 350° C.) on optical properties of the Ti/AlTiN/AlTiON/AlTiO solar selective coating deposited on SS substrate under cyclic heating conditions.

| Days | Total time of exposure (hrs) | α | ε |
|---|---|---|---|
| 18 | 120 | 0.924-0.925 | 0.13-0.15 |
| 22 | 152 | 0.923 | 0.14 |
| 28 | 190 | 0.923 | 0.15 |
| 37 | 249 | 0.922 | 0.15 |
| 43 | 293 | 0.923-0.924 | 0.17 |
| 53 | 354 | 0.923-0.924 | 0.17 |
| 73 | 491 | 0.919-0.921 | 0.16 |
| 87 | 588 | 0.921-0.922 | 0.16 |
| 110 | 740 | 0.920-0.921 | 0.16 |
| 121 | 815 | 0.920 | 0.16 |
| 126 | 849 | 0.920-0.921 | 0.16 |
| 140 | 940 | 0.919-0.920 | 0.15 |
| 150 | 1000 | 0.919-0.920 | 0.16 |

Example 4

The solar selective coating of the present invention, deposited on SS substrates following the procedure given in Example 1, was also subjected to heat-treatment in vacuum ($2.0$-$8.0 \times 10^{-4}$ Pa) for different temperatures and durations at cyclic heating conditions. Annealing involved increasing the temperature of the sample from room temperature to the desired temperature at a slow heating rate of 5° C./min and maintaining the desired temperature for 6 hrs. Subsequently, the samples were cooled down at a rate of 5° C./min. The accuracy of the temperature controller was ±1° C. at the set temperature. The absorptance and emittance values of the absorber coating are summarized in Table 4. As can be seen from Table 4, the coating retains its optical properties for temperature less than 500° C. Therefore, thermal stability tests were conducted for longer durations under cyclic heating conditions. The optical properties of the absorber coating were measured at regular intervals and are listed in Table 5. As can be seen from Table 5 the absorber coating deposited on SS substrates of the present invention retains its optical properties after subjecting to thermal annealing for long durations. No structural changes were observed as a result of prolonged heating. This demonstrates that the coating of the present invention can be used for applications in vacuum wherein the temperature is less than 450° C. (for example, receiver tubes).

TABLE 4

Effect of annealing (in vacuum) on optical properties of the Ti/AlTiN/AlTiON/AlTiO solar selective coating deposited on SS substrates.

| Temperature (° C.) | Duration (Hrs) | α | | ε | |
|---|---|---|---|---|---|
| | | As-deposited | Annealed | As-deposited | Annealed |
| 475 | 125 | 0.923-0.924 | 0.922-0.923 | 0.16 | 0.17 |
| 500 | 37 | 0.932-0.933 | 0.927-0.926 | 0.16 | 0.16 |
| 550 | 35 | 0.928-0.929 | 0.917-0.918 | 0.17 | 0.16 |
| 650 | 10 | 0.930-0.932 | 0.925-0.926 | 0.17 | 0.16 |
| 750 | 15 | 0.931-0.932 | 0.924-0.925 | 0.17 | 0.16 |
| 850 | 20 | 0.930-0.931 | 0.899-0.904 | 0.17 | 0.17 |

TABLE 5

Effect of annealing (in vacuum at 450° C.) on optical properties of the Ti/AlTiN/AlTiON/AlTiO solar selective coating deposited on SS substrates under cyclic heating conditions.

| Days | Total time of exposure (hrs) | α | ε |
|---|---|---|---|
| 0 | | 0.930-0.931 | 0.16 |
| 1 | 2 | 0.930-929 | 0.15 |
| 2 | 11 | 0.929 | 0.16 |
| 5 | 35 | 0.928-0.929 | 0.15 |
| 10 | 82 | 0.927-0.930 | 0.16 |
| 16 | 128 | 0.928 | 0.14 |
| 21 | 171 | 0.927 | 0.14 |
| 26 | 213 | 0.927 | 0.14 |
| 31 | 254 | 0.926-0.927 | 0.15-0.16 |
| 36 | 297 | 0.927 | 0.17 |
| 41 | 340 | 0.927 | 0.15-0.16 |
| 51 | 420 | 0.927 | 0.16 |
| 56 | 463 | 0.928-0.929 | 0.16 |
| 102 | 839 | 0.926-0.927 | 0.14 |
| 123 | 1004 | 0.925-0.926 | 0.15-0.16 |

Example 5

The solar selective coating of this invention deposited on SS substrates following the procedure given in Example 1 is also subjected to UV irradiation. The UV irradiation tests have been carried out using a 200 W Hg lamp at an intensity of 50 mW/cm$^2$. The exposure has been done for 10 hrs under ambient conditions in successive steps. No degradation in the absorptance and emittance was observed after UV exposure. The absorptance and emittance values after UV exposure are listed in Table 6.

TABLE 6

Absorptance and emittance data of solar selective coating deposited on stainless steel substrate after UV exposure.

| Exposure duration (Hrs) | α | | ε | |
|---|---|---|---|---|
| | As-deposited | After UV exposure | As-deposited | After UV exposure |
| 10 | 0.928-0.929 | 0.928-0.929 | 0.16-0.17 | 0.15-0.16 |

Example 6

The solar selective coating of the present invention, deposited on SS substrate following the procedure given in Example 1, is subjected to salt spray test in 3.5% NaCl solution as per ASTM B117 standard. The tests were carried out for 168 hrs. No significant changes in the absorptance and emittance were observed as a result of the salt spray test and the data is presented in Table 7. The same sample when tested repetitively for 3 times showed a marginal increase in the emittance as shown in Table 7.

TABLE 7

Absorptance and emittance data of solar selective coating deposited on stainless steel substrate after salt spray tests as per ASTM B117 standard.

| Exposure duration (Hrs) | α As-deposited | α After salt-spray test | ε As-deposited | ε After salt-spray test |
|---|---|---|---|---|
| 168 | 0.931-0.932 | 0.926-0.927 | 0.17 | 0.20 |
| 432 | 0.930-0.931 | 0.939-0.942 | 0.17 | 0.25 |

The solar selective coating of the present invention, deposited on SS substrates following the procedure given in Example 1, was also subjected to corrosion testing in 3.5% NaCl solution (pH=5.8) in free air condition at room temperature as per the procedure described in Thin Solid Films 514 (2006) 204. For SS/Ti/AlTiN/AlTiON/AlTiO/etching solar selective coating deposited on SS substrate the obtained values of $E_{corr}$, $i_{corr}$ and polarization resistance ($R_p$) are displayed in Table 8. The corrosion current density of the coated substrate decreased by a factor of 100, showing improved corrosion resistance of the coating, which is due to the chemical inertness of the constituent layers of the solar selective coating.

TABLE 8

Potentiodynamic polarization data of Ti/AlTiN/AlTiON/AlTiO solar selective coating deposited on SS substrate in 3.5% NaCl solution. Also, shown are the values for SS substrate.

| Material | $i_{corr}$ (μA/cm$^2$) | $E_{corr}$ (V) | $R_p$ (kΩ cm$^2$) |
|---|---|---|---|
| SS | −0.241 | $4.80 \times 10^{-8}$ | $2.13 \times 10^5$ |
| SS/Ti/TiAlN/TiAlON/TiAlO | −0.282 | $4.04 \times 10^{-10}$ | $3.72 \times 10^7$ |

Example 7

Robustness of the absorber coating is very important as the absorber coating should have a service life of more than 25 years. In order to test the robustness of the coating, adhesion tests were carried out on the absorber coating deposited on SS substrates. The adhesion tests were carried out using a conventional tape test and using a nanoscratch tester. The absorber coating of the present invention passed the tape test, wherein 18 mm wide scotch tape was fixed on the coating and one of the ends of the tape was pulled up. Similarly, the coating was also scratched using a 5 μm diameter spherical diamond indenter at a load of 200 mN as per the procedure described in Surface and Coatings Technology 205 (2010) 1937. Approximately 120 nm thick coating deposited on SS substrate demonstrated $Lc_1$=40 mN and $Lc_2$=75 mN, where $Lc_1$ is initial point of coating detachment or cracking on the scratch track and $Lc_2$ refers to the point at which complete delamination occurs and subsequent exposure of the substrate takes place. These measurements indicated very good adhesion of absorber coating on the substrate.

Example 8

External environment exposure tests have been conducted by putting absorber coating prepared on SS substrates in a petri-dish without a lid. The sample was kept in open conditions for more than 10000 hrs. During the test the sample got exposed to dust, sunlight, rain, frost and mist. The absorptance and emittance values of the sample after exposing to external environment are presented in Table 9. Similarly, the sample was put in freezing conditions in a freezer for long durations (9600 hrs) to elucidate its stability at low temperatures (<−2° C.). The optical properties of the sample before and after exposure to ice are listed in Table 10. Finally, the absorber coating of the present invention was exposed to steam, wherein the absorber coating prepared on SS substrate was kept over a beaker with boiling water. This exposure was done for 84 hrs. The absorptance and emittance values of the absorber coating after steam exposure are listed in Table 11. As can be seen from Tables 9-11, no changes in the optical properties of the absorber coating of the present invention were observed as a result of different aging tests, indicating its stability under harsh environments.

The efficiency of photothermal conversion at high temperatures strongly depends on the optical properties and thermal stability of the component materials used in the solar absorbers. For concentrating solar power applications, the spectrally selective coatings should have high absorptance (>0.92), low emittance (<0.14) and thermal stability above 400° C. in air and vacuum. In addition, long term thermal stability of the coatings in air and vacuum is also an important requirement for high temperature solar selective coatings. Furthermore, the coatings should have high oxidation resistance and chemical inertness.

For high temperature applications, low emittance at higher operating temperatures is an important parameter, because the thermal radiative losses of the absorbers increase proportionally by $T^4$. As discussed in the prior-art, several transition metal based cermet coatings have been developed for high temperature solar thermal applications, because of their refractory nature. The choice of the dielectric material is also very important for the performance of the selective absorber. In general, dielectric materials with low refractive index are preferred in order to reduce the front surface reflections of the cermet coating. $Al_2O_3$ is widely used as a dielectric material in cermet coatings due to its low refractive index (n=1.65) and high thermal stability. A large number of cermet coatings have been developed using Pt, Ni, Mo, W as metals and $Al_2O_3$ as the dielectric material. Similarly, transition metal nitrides and oxinitrides have also been developed for high temperature solar selective applications.

For manufacturing high temperature absorber coatings for receiver tube applications, the manufacturing process should include less processing steps and also should use raw materials, which are easily available. In the present invention, the absorber coating has been manufactured using a single sputtering process. The source materials (i.e., Ti and Al) are easily available abundantly. The coating design consists of two absorber layer and an anti-reflection layer. The content of Al in all the layers was higher than Ti. This helps in improving the thermal stability of the absorber coating as Gibbs energy of $Al_2O_3$ is low as compared to $TiO_2$. The absorber coating has been tested under vacuum and air for long durations under cyclic heating conditions. The coating has also passed several other aging tests, confirming its use for high temperature solar selective applications.

TABLE 9

Absorptance and emittance data of solar selective coating deposited on stainless steel substrate after ageing tests in open atmosphere.

| Exposure duration (Hrs) | α | | ϵ | |
|---|---|---|---|---|
| | As-deposited | After ageing test | As-deposited | After ageing test |
| 10000 | 0.932-0.933 | 0.951-0.952 | 0.17 | 0.18 |

TABLE 10

Absorptance and emittance data of solar selective coating deposited on stainless steel substrate after freezing tests.

| Exposure duration (Hrs) | α | | ϵ | |
|---|---|---|---|---|
| | As-deposited | After ageing test | As-deposited | After ageing test |
| 9600 | 0.933-0.934 | 0.937-0.938 | 0.17 | 0.17 |

TABLE 11

Absorptance and emittance data of solar selective coating deposited on stainless steel substrate after exposure to steam.

| Exposure duration (Hrs) | α | | ϵ | |
|---|---|---|---|---|
| | As-deposited | After ageing test | As-deposited | After ageing test |
| 84 | 0.933-0.934 | 0.937-0.938 | 0.17 | 0.17 |

ADVANTAGES OF THE INVENTION

The present invention uses only Ti and Al sputtering targets for the manufacture of high temperature solar selective coating. Both Ti and Al are abundantly available. The process developed in the present invention is cost effective.

The compositions of the first, second and third layers of the present invention are independently controlled by controlling the power to the Al and Ti targets and the flow rates of $N_2$ and $O_2$.

The present invention uses only a single deposition chamber to manufacture high temperature solar selective coating.

The present invention uses only pulsed DC power supplies to sputter transition metal nitride, oxynitride and oxide layers, which are easy to scale up as compared to RF power supplies.

The present invention provides substantially improved solar selective coating in respect of thermal stability. The absorber coating of the present invention showed stability up to 450° C. in vacuum for 1000 hrs and up to 350° C. in air for 1000 hrs under cyclic heating conditions.

The process of the present invention can be used to deposit high temperature solar selective coating on tubes, thus, up-scaling of the process can lead to deposition of absorber coating on long SS tubes to be used for solar thermal power generation.

The solar selective coating of the present invention demonstrates UV stability, corrosion resistance, superior mechanical properties and improved adhesion to the substrate.

The solar selective coating of the present invention showed solar selectivity ratio in the order of 9-10 on stainless steel substrate, which is commonly used for solar thermal power generation.

The solar selective coating of the present invention qualified a large number of aging tests when exposed to extreme environments such as: steam, ice, open atmosphere, etc.

I claim:

1. An improved solar selective coating having high thermal, stability comprising
    tandem stack of layers consisting of an interlayer of titanium (Ti)/Chrome followed by
        a first absorber layer comprising aluminum-titanium nitride (AlTiN);
        a second absorber layer comprising aluminum-titanium oxy-nitride (AlTiON); and
        a third antireflection layer comprising aluminum-titanium oxide (AlTiO);
    wherein said second absorber layer being deposited on the first absorber layer and said third antireflection layer being deposited on the second absorber layer at substrate temperature in the range 100-350° C. using a four-cathode reactive pulsed direct current unbalanced magnetron sputtering technique; and
    wherein the first absorber layer contains Aluminium in the range of 25-55%, Titanium in the range of 10-25% and Nitrogen in the range of 30-50%, the second absorber layer contains Aluminium in the range of 15-30%, Titanium in the range of 10-15%, Nitrogen in the range of 10-20% and Oxygen in the range of 50-60%, and the third anti-reflection layer contains Aluminium in the range of 15-30%, Titanium in the range of 5-15% and O in the range of 40-80%.

2. An improved solar selective coating as claimed in claim 1, wherein the thickness of the Titanium interlayer is in the range of 10-80 nm, thickness of the first absorber layer is in the range of 30-70 nm, thickness of the second absorber layer is in the range of 20-40 nm and thickness of the third antireflection layer is in the range of 30-55 nm.

3. An improved solar selective coating as claimed in claim 1, wherein thickness of the chrome interlayer is in the range of 5-10 μm, deposited by conventional electroplating.

4. An improved solar selective coating as claimed in claim 1, wherein the solar selective coating has absorptance greater than 0.92 and emittance less than 0.17 on stainless steel 304 substrate.

5. An improved solar selective coating as claimed in claim 1, wherein the solar selective coating has absorptance greater than 0.92 and emittance less than 0.07 on copper substrates.

6. An improved solar selective coating as claimed in claim 1, wherein the coating is thermally stable in air up to 350° C. for a duration of 1000 hrs on stainless steel substrates under cyclic heating conditions.

7. An improved solar selective coating as claimed in claim 1, wherein the coating is thermally stable in vacuum (2.0-8.0×$10^{-4}$ Pa) up to 450° C. for a duration of 1000 hrs on stainless steel substrates under cyclic heating conditions.

8. An improved solar selective coating as claimed in claim 1, wherein the coating is stable under exposure to ultraviolet (UV) irradiation.

9. An improved solar selective coating as claimed in claim 1, wherein the coating is stable at temperature under −2° C. for more than 9600 hrs.

10. An improved solar selective coating as claimed in claim 1, wherein the coating is stable when exposed to sun in ambient conditions including dust, rain and mist for more than 10000 hrs.

11. An improved solar selective coating as claimed in claim 1, wherein the coating is stable when exposed to steam for up to 85 hrs.

12. An improved solar selective coating as claimed in claim 1, wherein the coating deposited on stainless steel substrates qualifies salt spray test as per ASTM B117 standard and shows improvement in the corrosion resistance by a factor of 100 in 3.5% NaCl solution.

13. An improved solar selective coating as claimed in claim 1, wherein the coating deposited on stainless steel substrates qualifies tape adhesion test and demonstrates high adhesion strength while scratching using a 5 rim diamond tip.

14. A process for the deposition of improved solar selective coating of claim 1 on a substrate, comprising the following steps:
  [a] metallographic or buff cleaning of substrate;
  [b] chemical cleaning of the substrate as obtained in step [a];
  [c] degassing of the substrate as obtained in step [b] in vacuum using a substrate heater;
  [d] etching of the substrate as obtained in step [c] in Argon plasma to remove the impurities;
  [e] depositing a Titanium/Chrome interlayer on the substrate as obtained in step [d] in argon plasma by maintaining the substrate temperature in the range 100-350° C. and bias voltage in the range −50 to −200 V;
  [f] depositing a first absorber layer comprising aluminum titanium nitride (AlTiN) on the substrate as obtained in step [e] by sputtering two Titanium and two Aluminium targets in argon-nitrogen plasma by maintaining the substrate temperature in the range 100-350° C. and bias voltage in the range −50 to −200 V;
  [g] depositing a second absorber layer comprising aluminum-titanium oxy-nitride (AlTiON) on the substrate as obtained in step [f] by sputtering two Titanium and two Aluminium targets in argon-nitrogen-oxygen plasma by maintaining the substrate temperature in the range 100-350° C. and bias voltage in the range −50 to −200 V;
  [h] depositing a third antireflection layer comprising aluminum-titanium oxide (AlTiO) on the substrate as obtained in step [g] by sputtering two Titanium and two Aluminium targets in argon-oxygen plasma by maintaining the substrate temperature in the range of 100-350° C.; and
  [i] etching of the antireflection layer as obtained in step [h] in argon-oxygen plasma for a duration of 20-60 min by maintaining substrate temperature in the range 100-350° C. and bias voltage in the range −500 to −1200 V to obtain the substrate deposited with desired solar selective coating.

15. A process as claimed in claim 14, wherein the substrate used is selected from the group consisting of copper, nickel, stainless steel 304, glass nimonic, nickel coated stainless steel (SS), mild steel (MS) and aluminum.

16. A process as claimed in claim 14, wherein deposition of all the layers is done in a single sputtering chamber on flat and tubular metal and non-metal substrates.

17. A process as claimed in claim 14, wherein the solar selective coating is deposited at a sputtering power density of 2.75-3.5 watts/cm$^2$ for Aluminium and Titanium targets.

18. A process as claimed in claim 14, wherein compositions of the first, second and third layers are independently controlled by controlling the sputtering power to the Aluminium and Titanium targets and the flow rates of $N_2$ and $O_2$.

19. A process as claimed in claim 14, wherein vacuum chamber is maintained at a base pressure of $3.0$-$6.0 \times 10^{-4}$ Pa before deposition of the coating.

20. A process as claimed in claim 14, wherein the solar selective coating is deposited in the pressure range of 0.1-0.5 Pa.

* * * * *